(12) United States Patent
Ishii et al.

(10) Patent No.: US 11,921,068 B2
(45) Date of Patent: Mar. 5, 2024

(54) MOLECULAR WEIGHT MEASUREMENT METHOD AND SOLVENT FOR USE IN MEASUREMENT

(71) Applicant: Nippon Telegraph and Telephone Corporation, Tokyo (JP)

(72) Inventors: Azusa Ishii, Tokyo (JP); Takashi Miwa, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 775 days.

(21) Appl. No.: 17/056,217

(22) PCT Filed: May 10, 2019

(86) PCT No.: PCT/JP2019/018736
§ 371 (c)(1),
(2) Date: Nov. 17, 2020

(87) PCT Pub. No.: WO2019/225357
PCT Pub. Date: Nov. 28, 2019

(65) Prior Publication Data
US 2021/0181129 A1  Jun. 17, 2021

(30) Foreign Application Priority Data

May 21, 2018 (JP) .................... 2018-097320

(51) Int. Cl.
*G01N 24/08* (2006.01)
(52) U.S. Cl.
CPC .......... *G01N 24/08* (2013.01); *G01N 24/088* (2013.01)

(58) Field of Classification Search
CPC ....... G01N 24/08; G01N 24/088; G01R 33/46
See application file for complete search history.

(56) References Cited

FOREIGN PATENT DOCUMENTS

| JP | 2005193426 A | 7/2005 |
| JP | 2006083124 A | 3/2006 |

OTHER PUBLICATIONS

Karayannidis, G. P., et al. "Poly(ethylene terephthalate) recycling and recovery of pure terephthalic acid by alkaline hydrolysis." Advances in Polymer Technology, vol. 21, No. 4, May 3, 2002, pp. 250-259, https://doi.org/10.1002/adv.10029 (Year: 2002).*
Nishioka, "Introduction to Polymer Analysis," Introduction to Polymer Analysis, Apr. 10, 2010, pp. 136-137.

* cited by examiner

*Primary Examiner* — Jennifer Wecker
*Assistant Examiner* — Ali Husain Faraz
(74) *Attorney, Agent, or Firm* — Slater Matsil, LLP

(57) ABSTRACT

In a first step, a sample liquid is fabricated by mixing a sample formed of a polyester or decomposition products of a polyester into a solvent. The solvent used here contains chloroform and 2,2,2-trifluoroethanol and has an organic base added thereto. The organic base is at least one of a primary amine, a secondary amine, a tertiary amine and a heterocyclic amine. Next, in a second step, each of the amount of the terephthalic acid terminal and the amount of the hydroxy group terminal in the sample liquid is measured through a nuclear magnetic resonance spectroscopy aiming at hydrogen atoms. Subsequently, in a third step, the number average molecular weight of the sample is calculated from the amount of the terephthalic acid terminal and the amount of the hydroxy group terminal measured in the second step.

10 Claims, 4 Drawing Sheets

[Correction based on Article 26, 07 06, 2019]

[Correction based on Article 26, 07 06, 2019]

[Correction based on Article 26, 07 06, 2019]

MOLECULAR WEIGHT MEASUREMENT METHOD AND SOLVENT FOR USE IN MEASUREMENT

CROSS-REFERENCE TO RELATED APPLICATIONS

This application is a national phase entry of PCT Application No. PCT/JP2019/018736, filed on May 10, 2019, which claims priority to Japanese Application No. 2018-097320, filed on May 21, 2018, which applications are hereby incorporated herein by reference.

TECHNICAL FIELD

The present invention relates to a method for measuring a molecular weight that is for measuring the molecular weight of a polyester or its decomposition products, and to a solvent for measurement that is used in the measurement method.

BACKGROUND

Polyesters, such as thermoplastic polyesters, are used in a variety of applications, taking advantage of their excellent characteristics of achieving both strength and flexibility. For example, polyethylene terephthalate (PET) is used in films, fibers and bottles for beverages, some of which are also recycled.

When a polyester is degraded by heat or light, a molecular chain scission reaction is advanced, resulting in a decrease in performance such as strength. Accordingly, in the investigation of the long term reliability of polyester products, it is important to evaluate a number average molecular weight (Mn), which well reflects the degree of advance in the molecular chain scission reaction. In addition, a variety of recycling technologies have been developed for polyesters, but in a recycling technology that chemically decomposes polyesters into oligomers or monomers, it is important to figure out the number average molecular weight of the decomposition products in order to evaluate the advance in decomposition.

As described above, it is important to figure out the number average molecular weight of a polyester or decomposition products of a polyester. However, in size exclusion chromatography (SEC), which is the most common measurement method for obtaining a number average molecular weight, it takes several tens of minutes to measure a single sample, and if startup and shutdown operations of the device are included as well, it takes several hours to perform the overall measurement operation. Also, in the case of polyesters, it is common to use 1,1,1,3,3,3-hexafluoro-2-propanol (HFIP) as a solvent to dissolve the sample, but HFIP is an expensive solvent and the running cost becomes high when it is used in SEC. In addition, the number average molecular weight obtained in this analytical method is a molecular weight in terms of a standard sample such as polymethyl methacrylate, and does not necessarily coincide with the actual number average molecular weight.

As such, as a measurement method that can measure a number average molecular weight more simply and accurately while reducing the running cost, utilization of 1H NMR measurement can be considered. If the terminal functional groups of polymers can be quantified by the 1H NMR measurement, the number average molecular weight can be calculated. For polyethylene terephthalate (PET), a typical polyester, as a measurement condition that can quantify each of the terephthalic acid terminal and the hydroxy group terminal, a measurement method has been known in which a mixed solvent of chloroform/HFIP (volume ratio of 1:1) is used as a measurement solvent and a small amount of an amine is added (see Non-Patent Literature 1).

CITATION LIST

Non-Patent Literature

Non-Patent Literature 1: T. Nishioka, "Introduction to Polymer Analysis", KODANSHA LTD., 1st printing, Chapter 3, Part 2, page 136, published in 2010.

SUMMARY

Technical Problem

However, in the 1H NMR measurement currently used, there has been a problem that the exact peak of the terephthalic acid terminal cannot be observed, and therefore, the exact number average molecular weight of terephthalic acid cannot be calculated.

Embodiments of the present invention have been made in order to solve the problems as described above, and an object of embodiments of the present invention is to enable more accurate determination of the number average molecular weight of a polyester through a nuclear magnetic resonance spectroscopy aiming at hydrogen atoms.

Means for Solving the Problem

A method for measuring a molecular weight according to embodiments of the present invention comprises: a first step of mixing a sample formed of a polyester or decomposition products of a polyester into a solvent, thereby fabricating a sample liquid; a second step of measuring the amount of the terephthalic acid terminal and the amount of the hydroxy group terminal in the sample liquid through a nuclear magnetic resonance spectroscopy aiming at hydrogen atoms; and a third step of calculating the number average molecular weight of the sample from the amount of the terephthalic acid terminal and the amount of the hydroxy group terminal measured in the second step, and the solvent comprises chloroform and 2,2,2-trifluoroethanol and has an organic base added thereto.

In the above method for measuring a molecular weight, the organic base may be at least one of a primary amine, a secondary amine, a tertiary amine and a heterocyclic amine.

In the above method for measuring a molecular weight, in the solvent, 1,1,1,3,3,3-hexafluoro-2-propanol may be mixed in addition to chloroform and 2,2,2-trifluoroethanol.

In the above method for measuring a molecular weight, when the mixing ratio of chloroform, 2,2,2-trifluoroethanol and 1,1,1,3,3,3-hexafluoro-2-propanol in the solvent is defined as A:B:C, $4>A/C>1$ and $2>(A+B)/C>-1$ may be satisfied.

A solvent for measurement according to the embodiments of present invention is a solvent for measurement used in a method for measuring a molecular weight in which the amount of the terephthalic acid terminal and the amount of the hydroxy group terminal in a sample liquid obtained by mixing a sample formed of a polyester or decomposition products of a polyester into a solvent are measured through a nuclear magnetic resonance spectroscopy aiming at hydrogen atoms, thereby calculating the number average molecular weight of the sample, and the solvent comprises chloroform and 2,2,2-trifluoroethanol and has an organic base added thereto.

In the above solvent for measurement, the organic base may be at least one of a primary amine, a secondary amine, a tertiary amine and a heterocyclic amine.

In the above solvent for measurement, 1,1,1,3,3,3-hexafluoro-2-propanol may be mixed in addition to chloroform and 2,2,2-trifluoroethanol.

In the above solvent for measurement, when the mixing ratio of chloroform, 2,2,2-trifluoroethanol and 1,1,1,3,3,3-hexafluoro-2-propanol is defined as A:B:C, $4>A/C>1$ and $2>(A+B)/C>-1$ may be satisfied.

Effects of Embodiments of the Invention

As described above, since embodiments of the present invention use a solvent that comprises chloroform and 2,2,2-trifluoroethanol and has an organic base added thereto, an excellent effect can be obtained that the number average molecular weight of a polyester can be determined more accurately through a nuclear magnetic resonance spectroscopy aiming at hydrogen atoms.

DETAILED DESCRIPTION OF ILLUSTRATIVE EMBODIMENTS

Figure 1:
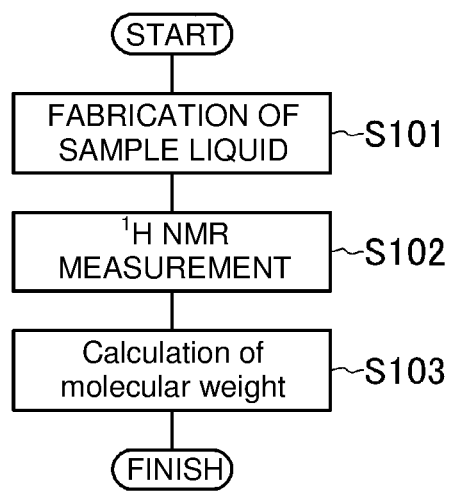
FIG. 1 is a flowchart for describing a method for measuring a molecular weight according to embodiments of the present invention.

Hereinafter, a method for measuring a molecular weight according to an embodiment of the present invention will be described with reference to FIG. 1.

At first, in a first step S101, a sample liquid is fabricated by mixing a sample formed of a polyester or decomposition products of a polyester into a solvent. The solvent used here comprises chloroform and 2,2,2-trifluoroethanol and has an organic base added thereto. The organic base is at least one of a primary amine, a secondary amine, a tertiary amine and a heterocyclic amine. Note that the polyester aimed at has thermoplasticity.

In addition, when the amines mentioned above are used as the organic base, in the above solvent, 1,1,1,3,3,3-hexafluoro-2-propanol may be mixed in addition to chloroform and 2,2,2-trifluoroethanol. In this case, when the mixing ratio of chloroform, 2,2,2-trifluoroethanol and 1,1,1,3,3,3-hexafluoro-2-propanol in the solvent is defined as A:B:C, $4>A/C>1$, $8>(A+B)/C>3$ and $5>(A-B)/C>2$ may be satisfied.

Next, in a second step S102, each of the amount of the terephthalic acid terminal and the amount of the hydroxy group terminal in the sample liquid is measured through a nuclear magnetic resonance spectroscopy aiming at hydrogen atoms. The temperature conditions for the measurement may be 30 to 50° C.

Subsequently, in a third step S103, the number average molecular weight of the sample is calculated from the amount of the terephthalic acid terminal and the amount of the hydroxy group terminal measured in the second step S102.

According to the embodiment mentioned above, measurement of the number average molecular weight of a polyester or decomposition products of a polyester is enabled through a nuclear magnetic resonance spectroscopy (1H NMR measurement) aiming at hydrogen atoms.

Here, how the present inventors have reached embodiments of the present invention will be described. When the present inventors attempted to quantify terephthalic acid in a polyester through $^1$H NMR measurement, it was found that the peak of the terephthalic acid terminal is not confirmed accurately. As a result of diligent researches on this situation, it was ascertained that the problem mentioned above is caused by the overlapping of the peak of terephthalic acid monomers in the decomposition products and the peak of the terephthalic acid terminal in the polyester.

According to the measurement using the solvent according to the embodiment mentioned above, in the $^1$H NMR measurement, the peak of terephthalic acid monomers in the decomposition products can be separated from the peak of the terephthalic acid terminal in the polyester, and it is possible to measure the terephthalic acid content.

Hereinafter, more detailed description will be given using the results of experiments and the like.

[NMR Measurement]

$^1$H NMR (300 MHz) was measured with a nuclear magnetic resonance device, Oxford, from Varian, Inc. The sample was dissolved in a measurement solvent (about 0.9 mL), an organic base (about 0.3 mg) was added, and the measurement was conducted at T° C. The chemical shift δ was expressed in ppm, with the peak of Me$_4$Si being 0 ppm. The coupling constant (J) is expressed in Hz, and the signal pattern is denoted by br (broad), s (singlet), d (doublet), t (triplet), q (quartet) and m (multiplet).

[Sample]

As the polyester that contains terephthalic acid as a raw material, for example, polyethylene terephthalate (PET), polybutylene terephthalate (PBT), polyneopentyl terephthalate (PNT), and copolymers thereof were used as the sample. In addition, not only terephthalic acid, but also isophthalic acid may be contained in a portion of the raw materials.

Alternatively, decomposition products of a polyester that contains terephthalic acid as a raw material, for example, chemically decomposed PET, were used as the sample.

In Comparative Examples and Examples, any of the followings was used as the sample. Note that Mn is the number average molecular weight.

[Sample-1] PET (Mn: about 14000), about 3 mg
[Sample-2] Terephthalic acid, about 3 mg
[Sample-3] Mixture of PET (Mn: about 14,000), about 2.7 mg and terephthalic acid, about 0.1 mg

[Measurement Solvent]

The following deuterated solvents were mixed for use in an arbitrary volume ratio.

Deuterated chloroform [containing $Me_4Si_{0.03}\%$ (v/v)] $CDCl_3$ 2,2,2-Trifluoroethanol-2d (TFEA-2d)

1,1,1,3,3,3-Hexafluoro-2-propanol-2d (HFIP-2d)

[Organic Base]

In Comparative Examples and Examples, any of the following organic bases was used.

Isopropylamine (primary amine)
Diethylamine (secondary amine)
N-Ethyldiisopropylamine (tertiary amine)
Pyridine (heterocyclic amine)

[Measurement Object Peak]

In Comparative Examples and Examples, the proton peaks represented by the following chemical formulas were measured.

(a): Protons derived from terephthalic acid in the repeated structure of a polyester (b) and (b'): Protons of an amine derivative of the terephthalic acid terminal of a polyester (c): Protons of an amine derivative of terephthalic acid

[Quantification Method of Terephthalic Acid]

When the peak of (c) was measured separately from other peaks in the $^1H$ NMR measurement, the molar concentration of terephthalic acid relative to the entire terephthalic acid structures in the sample, $C_{TPA}$ [mol %], was calculated according to "$C_{TPA}=(c)/\{(a)+(b)+(b')+(c)\}\times 100$" using the integrated value for each peak.

(d): Protons of the methylene group at the β position of the ester bond at the hydroxy group terminal (e): Protons of the methylene group at the α position of the ester bond at the hydroxy group terminal (f): Protons of the methylene groups at the α positions of the ester bonds in ether structures partially by produced during the production process (g): Peak of the protons of the methylene group in 2,2,2-trifluoroethanol

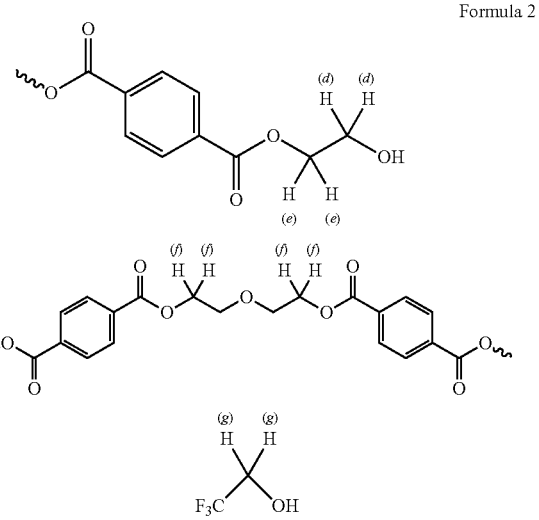

Formula 2

Formula 1

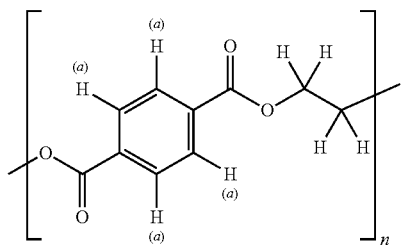

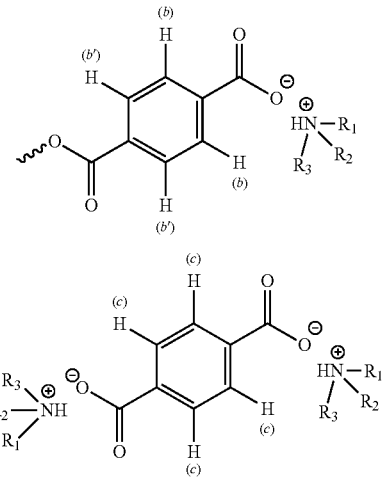

When the peak of (e) was measured separately from other peaks in the $^1H$ NMR measurement, the molar concentration of the hydroxy group terminal relative to the entire terephthalic acid structures of polymer components in the sample, $C_{OH}$ [mol %], was calculated according to "$C_{OH}=2\times(e)/\{(a)+(b)+(b')\}\times 100$" using the integrated value for each peak.

Comparative Example 1

In Comparative Example 1, measurement of the PET sample is performed under the measurement condition used in NMR measurement for the purpose of quantifying the terephthalic acid terminal of a polyester.

Figure 2:
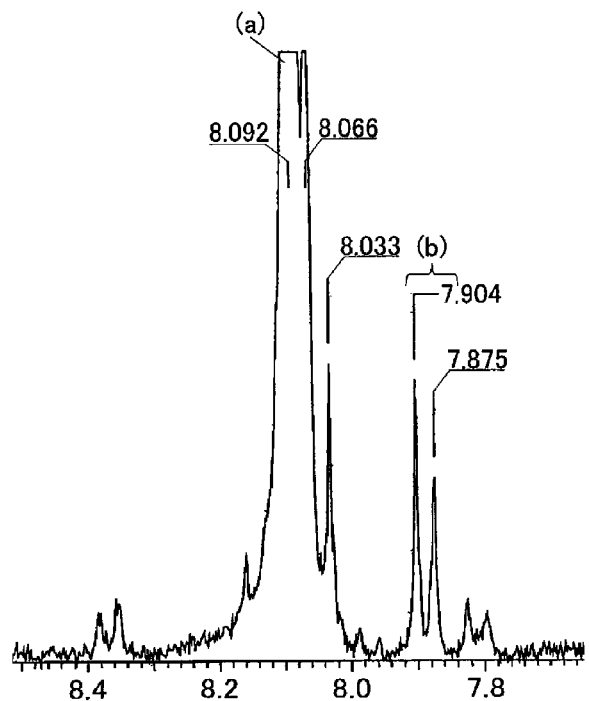
FIG. 2 is a characteristic diagram showing peaks obtained by performing $^1$H NMR measurement at T=50° C. for a sample of PET dissolved in a mixed solvent of CDCl$_3$/HFIP-2d, to which isopropylamine was added

About 3 mg of Sample-1: PET (Mn: about 14,000) was dissolved in a mixed solvent of $CDCl_3$/HFIP-2d (volume ratio of 1:1), isopropylamine (about 0.3 mg) was added, and the $^1H$ NMR measurement was carried out at T=50° C., thereby confirming the following peaks (see FIG. 2).

(a): δ 8.09 (s, 4H)
(b): δ 7.89 (d, J=8.7 Hz, 2H)

Comparative Example 2

Figure 3:
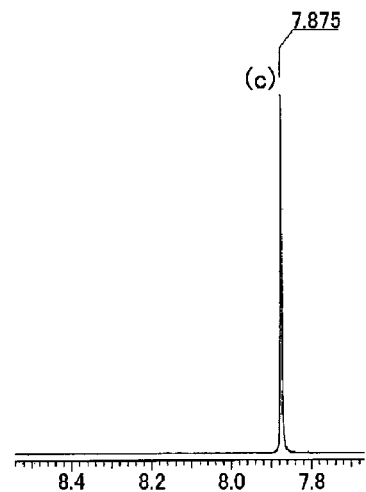
FIG. 3 is a characteristic diagram showing a peak obtained by performing $^1$H NMR measurement at T=50° C. for a sample of terephthalic acid dissolved in a mixed solvent of CDCl$_3$/HFIP-2d, to which isopropylamine was added

In Comparative Example 2, measurement of terephthalic acid is performed under the same conditions as in Comparative Example 1. Sample-2: terephthalic acid (about 3 mg) was measured under the same conditions as in Comparative Example 1, and the following peak was confirmed (see FIG. 3).

(c): δ 7.88 (s, 4H)

Comparative Example 3

In Comparative Example 3, measurement of a mixed sample of PET and terephthalic acid is performed under the same conditions as in Comparative Examples 1 and 2. When Sample-3: mixture of PET (Mn: about 14,000), about 2.7 mg and terephthalic acid, about 0.1 mg was measured under the same conditions as in Comparative Examples 1 and 2, the peaks of (b) and (c) were overlapped.

In Comparative Example 1, the peaks of the doublet in (b) decline on the right shoulder, whereas in Comparative Example 3, (c) overlaps with the peak on the side of higher magnetic field of the doublet, resulting in a rise in the right shoulder.

Figure 4:
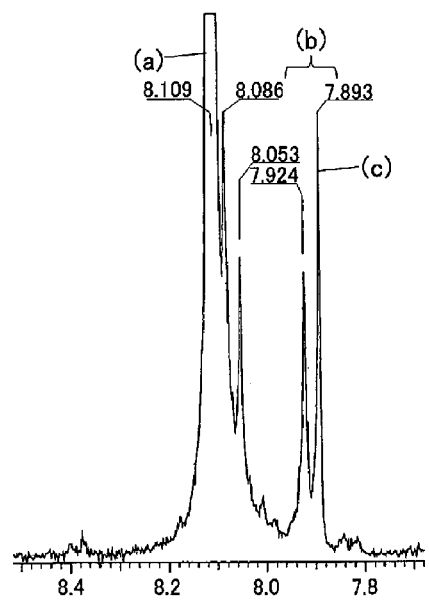
FIG. 4 is a characteristic diagram showing peaks obtained by performing $^1$H NMR measurement at T=50° C. for a sample of PET and terephthalic acid dissolved in a mixed solvent of CDCl$_3$/HFIP-2d, to which isopropylamine was added.

Note that there has been no reported case so far indicating that the peaks of (b) and (c) are overlapped when the sample is dissolved in a mixed solvent of [CDCl$_3$/HFIP-2d (volume ratio of 1:1)] under the present measurement condition, isopropylamine (about 0.3 mg) is added, and the $^1$H NMR measurement is performed at T=50° C. Through Comparative Examples 1 to 3, the present inventors revealed for the first time that separation of the peaks of (b) and (c) is a problem for quantifying terephthalic acid with the $^1$H NMR measurement (see FIG. 4).

(a): δ 8.11 (s, 4H)
(b): δ 7.91 (d, J=9.3 Hz, 2H)
(c): δ 7.89 (s, 4H)

Comparative Example 4

In Comparative Example 4, measurement is carried out changing the parameters of solvent mixing ratio, type of organic base, temperature and the like from those of Comparative Example 3.

Sample-3: mixture of PET (Mn: about 14,000), about 2.7 mg and terephthalic acid, about 0.1 mg was measured changing the parameters of solvent mixing ratio, type of organic base, temperature and the like from those of Comparative Example 3. Whether (b) and (c) can be separated or not in each measurement condition is shown in the following Table 1.

TABLE 1

$^1$H NMR measurement results with mixed solvent of CDCl$_3$/HFIP-2d

| Entry No. | CDCl$_3$/ HFIP-2d A:C | Organic base | Measurement temperature [° C.] | Separation of peaks of (b) and (c) |
|---|---|---|---|---|
| 1 (Comparative Example 3, reshown) | 1:1 | Isopropylamine | 50 | x |
| 2 | 1:4 | Isopropylamine | 50 | x |
| 3 | 4:1 | Isopropylamine | 50 | x |
| 4 | 1:1 | Diethylamine | 50 | x |
| 5 | 1:1 | N-Ethyl-diisopropylamine | 50 | x |
| 6 | 1:1 | Pyridine | 50 | x |
| 7 | 1:1 | Isopropylamine | 55 | x |
| 8 | 1:1 | Isopropylamine | 40 | x |
| 9 | 1:1 | Isopropylamine | 25 | x |

Comparative Example 5

In Comparative Example 5, measurement is carried out changing the types of solvents from those of Comparative Example 4. Changing from the mixed solvent of CDCl$_3$/HFIP-2d (1:1) used in Comparative Example 3, a mixed solvent of CDCl$_3$/TFEA-2d (1:1) was used to measure Sample-3: mixture of PET (Mn: about 14,000), about 2.7 mg and terephthalic acid, about 0.1 mg.

TFEA is a solvent that hardly dissolves PET, and is thus not used for the purpose of PET measurement in the NMR measurement, which requires dissolution of the sample. However, the present inventors focused on the fact that TFEA is an organic solvent that is not as acidic as HFIP but has high acidity, and performed Comparative Example 5 in order to confirm the effect of TFEA on the peak shift.

In Comparative Example 5, the mixed solvent was added to Sample-3 and isopropylamine was then added thereto, but a residue remaining undissolved was present at this stage. Therefore, this measurement sample was heated to about 50° C. for about 10 minutes, but the residue still remained. As such, when the $^1$H NMR measurement was carried out in the presence of solid components remaining undissolved, measurement data was obtained for a dissolved part of the sample, and it was confirmed that the peaks of (b) and (c) can be separated.

However, the peak of (d), which has been used for quantifying the hydroxy group terminal in a conventional measurement method (measurement condition of Comparative Example 1), overlapped with the peak of (g) of TFEA, and was therefore not quantifiable. As such, it was considered to quantify the peak (e) according to the hydroxy group terminal, but (e) overlapped with (f) and was therefore not quantifiable.

Comparative Example 6

In Comparative Example 6, measurement was performed changing the types of solvents and the mixing ratio thereof from those of Comparative Example 5. In Comparative Example 5, the mixed solvent of CDCl$_3$/TFEA-2d (volume ratio of 1:1) was used and the peaks of (b) and (c) were separated, but the peaks of (e) and (f) were not separated. In addition, the PET resin in Sample-3 was not dissolved in the mixed solvent.

Since TFEA hardly dissolves PET resins, the present inventors decided to investigate, as the mixed solvent, a ternary mixed solvent in which HFIP, which can dissolve PET resins, is also mixed into CDCl$_3$ and TFEA. In the NMR measurement, it is most common to use a single solvent as the measurement solvent, and when there is a problem in the solubility of the sample or the like, a binary mixed solvent may be used, but it is not common to use a ternary mixed solvent.

The results of measurements at different mixing ratios of the solvents are shown in Table 2. In all conditions, the organic base is isopropylamine and the measurement temperature is 50° C. In Entry Nos. 11 to 17, there was no condition that achieves both separation of the peaks of (b) and (c) and separation of the peaks of (e) and (f).

TABLE 2

$^1$H NMR measurement results with
mixed solvent of CDCl$_3$/TFEA-2d/HFIP-2d

| Entry No. | CDCl$_3$/TFEA-2d/HFIP-2d A:B:C | Dissolution of sample | Separation of peaks of (b) and (c) | Separation of peaks of (e) and (f) |
|---|---|---|---|---|
| 1 (Comparative Example 3) | 1:0:1 | ○ | × | × |
| 10 (Comparative Example 4) | 1:1:0 | × | ○ | × |
| 11 | 1:1:1 | ○ | × | × |
| 12 | 1:2:1 | ○ | × | Δ |
| 13 | 1:3:1 | Δ | × | Δ |
| 14 | 2:1:1 | ○ | × | × |
| 15 | 3:1:1 | ○ | Δ | × |
| 16 | 4:1:1 | ○ | ○ | × |
| 17 | 3:2:1 | ○ | ○ | Δ |

Hereinafter, Examples to which embodiments of the present invention were applied will be described.

Example 1

Figure 5:
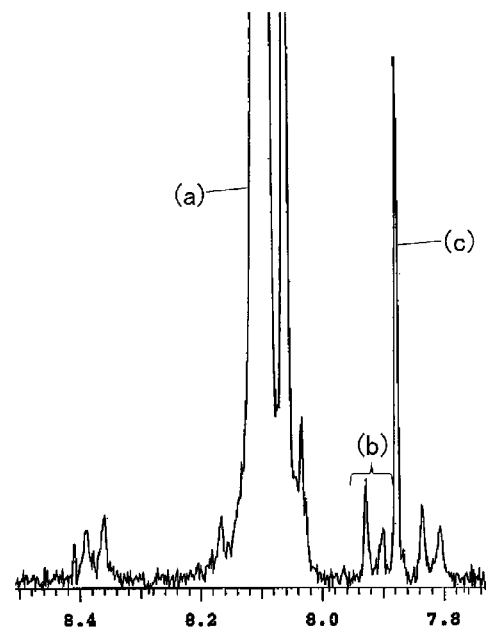
FIG. 5 is a characteristic diagram showing peaks obtained by performing $^1$H NMR measurement at T=50° C. for a sample of PET and terephthalic acid dissolved in a mixed solvent of CDCl$_3$/TFEA-2d/HFIP-2d, to which isopropylamine was added.
Figure 6:
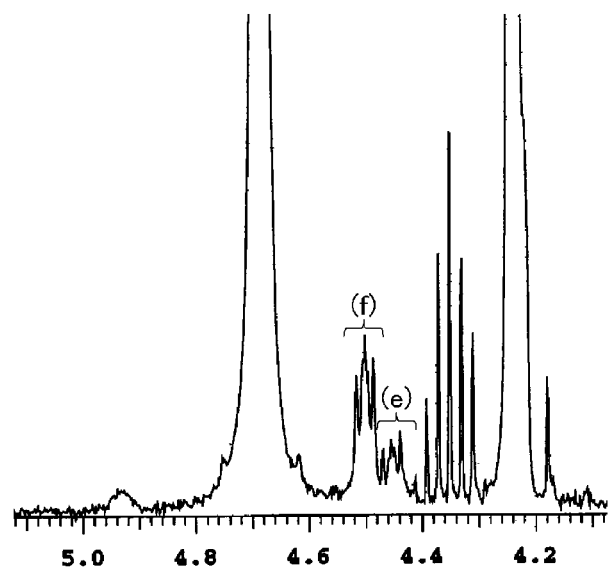
FIG. 6 is a characteristic diagram showing peaks obtained by performing 1H NMR measurement at T=50° C. for a sample of PET and terephthalic acid dissolved in a mixed solvent of CDCl$_3$/TFEA-2d, to which isopropylamine was added.

In Example 1, measurement is performed changing the mixing ratios of solvents from those of Comparative Example 6. The $^1$H NMR measurement was carried out for [Sample-3] changing the mixing ratios of the ternary mixed solvent used in Comparative Example 6. The measurement results are shown in Table 3. For all of Entry No. 18 to Entry No. 20, the sample was dissolved, and the peaks of (b) and (c) were separated and the peaks of (e) and (f) were separated [see FIG. 5 and FIG. 6]. From the integrated values of peaks, C$_{COOH}$ and C$_{OH}$ were determined. Note that the asterisk (*) in the table indicates the result calculated from (d) instead of (e).

(a): δ 8.10 (s, 4H)
(b): δ 7.91 (d, J=8.4 Hz, 2H)
(c): δ 7.88 (s, 4H)
(e): δ 4.47 (t, J=4.5 Hz, 2H)
(f): δ 4.51 (t, J=4.8 Hz, 4H.

Figure 7:
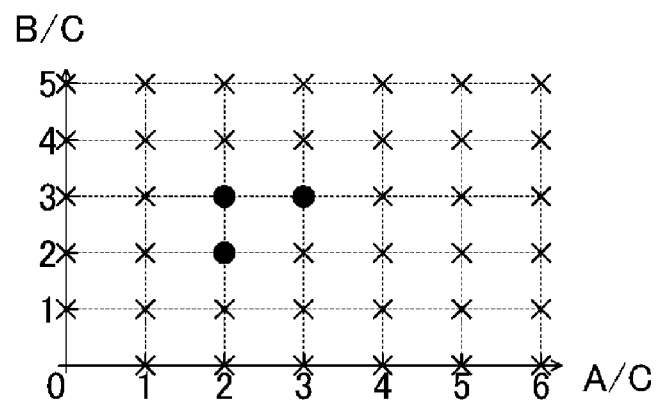
FIG. 7 is an explanatory diagram showing, for the mixing ratio of chloroform, 2,2,2-trifluoroethanol and 1,1,1,3,3,3-hexafluoro-2-propanol (A:B:C), the relationship among A/C, B/C and the separation between the proton peak of an amine derivative of the terephthalic acid terminal of a polyester and the proton peak of an amine derivative of terephthalic acid.

Here, in the solvent according to the embodiment 1, the mixing ratio of chloroform, 2,2,2-trifluoroethanol and 1,1,1,3,3,3-hexafluoro-2-propanol is defined as A:B:C. In addition, as shown in FIG. 7, A/C is taken on the horizontal axis and B/C is taken on the vertical axis, and the points where (b) and (c) were separated are marked with "○", and the points where they were not separated and where dissolution of the sample was insufficient are marked with "×". From FIG. 7, for sufficient separation of (b) and (c), it is necessary to satisfy the conditions "4>A/C>1 and 2>(B−A)/C>−1".

Example 2

In Example 2, measurement was carried out changing the type of the organic base and the measurement temperature from those of Example 1. Based on Example Entry No. 20 [CDCl$_3$/TFEA-2d/HFIP-2d (2:2:1) was used as the mixed solvent], the measurement was carried out changing the type of the organic base and the measurement temperature. The results are shown in Table 4.

For all of Entry No. 21 to Entry No. 26, the sample was dissolved, and the peaks of (b) and (c) were separated and the peaks of (e) and (f) were separated. From the integrated values of peaks, C$_{COOH}$ and C$_{OH}$ were determined, thereby calculating Mn.

It was confirmed that the organic base to be added is not limited to isopropylamine (primary amine) and may be diethylamine (secondary amine) or N-ethyldiisopropylamine (tertiary amine). It can be readily analogized that n-propylamine, n-butylamine, sec-butylamine, tert-butylamine, n-pentylamine, diisopropylamine, dibutylamine, triethylamine, tributylamine and the like are also available.

In addition, with respect to the measurement temperature, based on the fact that the boiling point of each solvent is as follows: chloroform 61° C.; TFEA 72° C.; and HFIP 58° C., and also the solvents are easily admixed at a higher temperature, the measurement was also performed at 55° C., 40° C. and 30° C. and it was confirmed that the measurement may be carried out at any of these temperatures.

TABLE 3

$^1$H NMR measurement results with mixed solvent of CDCl$_3$/TFEA-2d/HFIP-2d

| Entry No. | CDCl$_3$/TFEA-2d/HFIP-2d A:B:C | Dissolution of sample | Separation of peaks of (b) and (c) | Separation of peaks of (e) and (f) | C$_{cooH}$ calculated value [mol %] | C$_{OH}$ calculated value [mol %] | Mn calculated value |
|---|---|---|---|---|---|---|---|
| 1 (Comparative Example 3) | 1:0:1 | ○ | × | × | — | 1.7* | — |
| 11 (Comparative Example 6) | 1:1:1 | ○ | × | × | — | — | — |
| 17 (Comparative Example 6) | 3:2:1 | ○ | ○ | Δ | 1.0 | — | — |
| 18 | 3:3:1 | ○ | ○ | ○ | 1.0 | 1.8 | 1.4 × 10$^4$ |
| 19 | 2:3:1 | ○ | ○ | ○ | 0.9 | 1.7 | 1.5 × 10$^4$ |
| 20 | 2:2:1 | ○ | ○ | ○ | 1.0 | 1.7 | 1.4 × 10$^4$ |

TABLE 4

| Entry No. | Organic base | Measurement temperature [° C.] | Separation of peaks of (b) and (c) | Separation of peaks of (e) and (f) | $C_{COOH}$ calculated value [mol %] | $C_{OH}$ calculated value [mol %] | Mn calculated value |
|---|---|---|---|---|---|---|---|
| 20 (Example 1) | Isopropylamine | 50 | ○ | ○ | 1.0 | 1.7 | $1.4 \times 10^4$ |
| 21 | Diethylamine | 50 | ○ | ○ | 1.0 | 1.7 | $1.4 \times 10^4$ |
| 22 | N-Ethyldiisopropylamine | 50 | ○ | ○ | 1.0 | 1.8 | $1.4 \times 10^4$ |
| 23 | Pyridine | 50 | ○ | ○ | 1.0 | 1.6 | $1.5 \times 10^4$ |
| 24 | Isopropylamine | 55 | ○ | ○ | 1.0 | 1.7 | $1.4 \times 10^4$ |
| 25 | Isopropylamine | 40 | ○ | ○ | 1.0 | 1.7 | $1.4 \times 10^4$ |
| 26 | Isopropylamine | 30 | ○ | ○ | 1.0 | 1.7 | $1.4 \times 10^4$ |

When determination of the number average molecular weight in a polyester or decomposition products of a polyester is carried out with size exclusion chromatography, it takes several tens of minutes to measure a single sample, and if startup and shutdown operations of the device are included as well, it takes several hours to perform the overall quantification operation. In addition, since the amount of HFIP to be used, which is an expensive solvent, is large, the running cost of the measurement is high. Furthermore, the value obtained through size exclusion chromatography is a number average molecular weight in terms of PMMA used as the standard sample, and it is not an accurate number average molecular weight. In order to determine an accurate number average molecular weight more simply and cheaply, mention may be made of a measurement method in which the terminal groups (terephthalic acid terminal and hydroxy group terminal) of the polyester are quantified through NMR.

In the NMR measurement, it is necessary to dissolve the sample in a solvent, and in the polyester measurement, a mixed solvent of 1,1,1,3,3,3-hexafluoro-2-propanol and chloroform, which dissolves a polyester well, is commonly used. However, the present inventors confirmed that, with the NMR measurement using the above mixed solvent, it is difficult to separate the peak of terephthalic acid from those of other components, and when terephthalic acid is intermingled in a sample, it is difficult to separate the peak of the terephthalic acid terminal of the polyester from the peak of terephthalic acid. Therefore, when terephthalic acid is intermingled in a sample, it was confirmed that quantification of the terephthalic acid terminal of the polyester cannot be carried out accurately.

The number average molecular weight is an important indicator in evaluating the degree of degradation of polyesters by light or heat and in evaluating the degree of decomposition of polyesters in the recycling process, but these samples often contain terephthalic acid as a decomposition product of polyesters. As such, the inability to accurately assess the number average molecular weight of polyester samples in which terephthalic acid is intermingled can be problematic.

For the conventional problems mentioned above, the present inventors have investigated a measurement method that can separate the peak of the terephthalic acid terminal from that of terephthalic acid in the NMR measurement of a polyester, and can also quantify the hydroxy group terminal at the same time.

2,2,2-Trifluoroethanol is a solvent that hardly dissolves polyesters and is generally not used in the NMR measurement for polyesters. However, in embodiments of the present invention, the present inventors focused on the fact that 2,2,2-trifluoroethanol has relatively high acidity, and considered that it may be applicable as the measurement solvent for polyesters if it is used as a mixed solvent. Then, by using a mixed solvent that contains 2,2,2-trifluoroethanol, adding an organic base thereto, and carrying out the measurement, separation of the peak of the terephthalic acid terminal of the polyester from the peak of terephthalic acid was achieved.

However, when 2,2,2-trifluoroethanol is contained in the measurement solvent, the peak of the protons of the methylene group with a hydroxy group, which is usually used for quantifying the hydroxy group terminal, overlaps with the peak of 2,2,2-trifluoroethanol, and therefore, quantification cannot be carried out. In response to this problem, the present inventors decided to quantify the peak of the protons of the methylene group adjacent to the methylene group with a hydroxy group, but this peak overlapped with another peak. From the above findings, the present inventors have found a condition under which the above peak can be separated from another peak and can be quantified by adjusting the mixing ratio of solvents.

Embodiments of the present invention make it possible to accurately quantify the amount of the terephthalic acid terminal and the amount of the hydroxy group terminal in a polyester or decomposition products of a polyester through $^1$H NMR measurement, thereby making it possible to calculate the number average molecular weight of the polyester or decomposition products of the polyester more accurately than the conventional NMR measurement method.

As described above, since embodiments of the present invention use a solvent that comprises chloroform and 2,2,2-trifluoroethanol and has an organic base added thereto, more accurate determination of the number average molecular weight of a polyester is enabled through a nuclear magnetic resonance spectroscopy aiming at hydrogen atoms.

Note that the present invention is not limited to the embodiments described above, and it is obvious that those having ordinary skill in the art can make many modifications and combinations without departing from the technical idea of the invention.

The invention claimed is:

1. A method for measuring a molecular weight, the method comprising:
   mixing a sample into a solvent to fabricate a sample liquid, wherein the sample liquid is formed of a polyester or decomposition products of a polyester, wherein the solvent comprises chloroform and 2,2,2-trifluoroethanol, and wherein the solvent has an organic base added thereto;
   measuring an amount of terephthalic acid terminals and an amount of hydroxy group terminals in the sample liquid through a nuclear magnetic resonance spectroscopy aiming at hydrogen atoms; and of calculating a number average molecular weight of the sample liquid from the amount of terephthalic acid terminals and the amount of hydroxy group terminals in the sample liquid.

2. The method for measuring a molecular weight according to claim 1, wherein the organic base a primary amine, a secondary amine, a tertiary amine, or a heterocyclic amine.

3. The method for measuring a molecular weight according to claim 2, wherein the solvent further comprises 1,1,1,3,3,3-hexafluoro-2-propanol mixed with the chloroform and the 2,2,2-trifluoroethanol.

4. The method for measuring a molecular weight according to claim 3, wherein, a mixing ratio of the chloroform to the 2,2,2-trifluoroethanol to the 1,1,1,3,3,3-hexafluoro-2-propanol in the solvent is defined as A:B:C, and wherein $4>A/C>1$.

5. The method for measuring a molecular weight according to claim 4, wherein $2>(A+B)/C>-1$.

6. A solvent for measurement, comprising:
chloroform; and
2,2,2-trifluoroethanol, wherein the solvent has an organic base added thereto, wherein the solvent is adapted for measuring a molecular weight based on an amount of terephthalic acid terminals and an amount of hydroxy group terminals in a sample liquid, wherein the sample liquid is obtained by mixing a sample into the solvent, wherein the sample liquid is formed of a polyester or decomposition products of a polyester, and wherein the amount of terephthalic acid terminals and the amount of hydroxy group terminals in the sample liquid are measured through a nuclear magnetic resonance spectroscopy aiming at hydrogen atoms.

7. The solvent for measurement according to claim 6, wherein the organic base is a primary amine, a secondary amine, a tertiary amine, or a heterocyclic amine.

8. The solvent for measurement according to claim 7, further comprising 1,1,1,3,3,3-hexafluoro-2-propanol mixed with the chloroform and the 2,2,2-trifluoroethanol.

9. The solvent for measurement according to claim 8, wherein a mixing ratio of the chloroform to the 2,2,2-trifluoroethanol to the 1,1,1,3,3,3-hexafluoro-2-propanol is defined as A:B:C, and wherein $4>A/C>1$.

10. The solvent for measurement according to claim 9, wherein $2>(A+B)/C>-1$.

* * * * *